United States Patent [19]

Saadat et al.

[11] Patent Number: 5,279,988
[45] Date of Patent: Jan. 18, 1994

[54] PROCESS FOR MAKING MICROCOMPONENTS INTEGRATED CIRCUITS

[76] Inventors: Irfan Saadat, 1255 Lincoln St. #8, Santa Clara, Calif. 95050; Michael E. Thomas, 2258 Devon Pl., Milpitas, Calif. 95035

[21] Appl. No.: 861,427

[22] Filed: Mar. 31, 1992

[51] Int. Cl.$^5$ ............................................. H01L 21/441
[52] U.S. Cl. .................................... 437/195; 437/192; 437/194; 437/978
[58] Field of Search ............... 437/195, 978, 192, 194, 437/245

[56] References Cited

U.S. PATENT DOCUMENTS

| | | | |
|---|---|---|---|
| 4,407,859 | 10/1983 | Jones | 427/89 |
| 4,764,484 | 8/1988 | Mo | 437/195 X |
| 5,063,175 | 11/1991 | Broadbent | 437/195 X |

OTHER PUBLICATIONS

"Transformers For Electronic Circuits", Second Edition, Nathan R. Grossner and Isabel S. Grossner, McGraw-Hill Book Company, New York, 1983, pp. 1-6.

"Magnetic Materials", F. Brailsford, John Wiley & Sons, Inc., New York, Section 1.3 (pp. 12-15 and Chapter VII (pp. 160-181) (no date available).

*Primary Examiner*—John S. Maples
*Attorney, Agent, or Firm*—Stephen R. Robinson; William H. Murray

[57] ABSTRACT

A process for fabricating discrete electrical microcomponents, such as microtransformers, microautotransformers and microinductors, on a semiconductor substrate in which two patterned layers of electrically conductive material are electrically connected through vias in two interposed layers of electrically insulating material to form electrically conductive coils around a magnetic core formed by a patterned layer of magnetic material interposed between the two insulating layers. Laminated magnetic cores may be formed by patterning multiple layers of magnetic material. The microcomponents can also be formed without magnetic cores and can be formed on insulating substrates.

26 Claims, 16 Drawing Sheets

PROCESS FOR MAKING MICROCOMPONENTS INTEGRATED CIRCUITS

BACKGROUND OF THE INVENTION

The present invention relates to integrated circuits and more particularly to microcomponents, such as microtransformers, microautotransformers and microinductors formed on substrates or as part of integrated circuits.

Typically, discrete components such as inductors and transformers, are physically attached to an integrated circuit carrier and are electrically connected to the integrated circuit using standard wire bonding techniques. The problem with this arrangement is that relatively few discrete components can be used in connection with an integrated circuit. Accordingly, it is desirable to fabricate such components as part of the integrated circuit thereby increasing the density of such components and enabling them to be used in large numbers heretofore unavailable on VLSI integrated circuits. This will permit on-chip fabrication of integrated circuits, such as low pass, band pass and high pass filters, which require discrete components such as inductors; as well as on-chip fabrication of transformers and autotransformers which can be used to shift voltages and provide impedance matching on the chip.

SUMMARY OF THE INVENTION

A process for fabricating discrete electrical microcomponents such as microtransformers, microautotransformers and microinductors. The process includes the steps of disposing a layer of electrically insulating material over a semiconductor substrate having active devices disposed therein. Opening vias in the layer of insulating material to expose predetermined electrical contact areas on the underlying substrate. Disposing a first layer of electrically conductive material over the insulating layer into the vias contacting the exposed contact areas on the underlying substrate. Forming the first layer of electrically conductive material into a first predetermined pattern.

Disposing a second layer of electrically insulating material over the first insulating layer and the patterned first metal layer. Disposing a first layer of a magnetic material on the second insulating layer. Forming the first layer of magnetic material into a predetermined pattern having a predetermined positional relationship with respect to the underlying patterned first layer of electrically conductive material. Disposing a third layer of electrically insulating material over the second layer of insulating material and the patterned first layer of magnetic material. Forming additional layers of patterned magnetic material and overlying insulating layers as required to reduce magnetic losses.

Opening vias in the multiple layers of insulating material to expose predetermined electrical contact areas of the underlying patterned first electrically conductive layer. Disposing a second electrically conductive layer over the upper most insulating layer into the vias to contact the exposed electrical contact areas of the underlying patterned first electrically conductive layer. Forming the second electrically conductive layer into a second predetermined pattern having a predetermined spaced relationship with respect to the underlying patterned layer of magnetic material and the patterned first layer of electrically conductive material. Forming a final layer of electrically insulating material over the second patterned electrically conductive layer; then, if required by a particular application, opening contacts or vias to the second patterned electrically conductive layer to provide electrical access to the completed electrical component.

An alternate embodiment of the process of the present invention includes the steps of disposing a layer of electrically conductive material over an insulating substrate. Forming the layer of electrically conductive material into a first predetermined pattern. Disposing a second layer of electrically insulating material over the first insulating layer and the patterned first metal layer then continuing on with the steps of disposing a first layer of a magnetic material on the second insulating layer and subsequent steps described above up to and including the steps of forming a final layer of electrically insulating material over the second patterned electrically conductive layer; then opening contacts or vias to the second metal layer and/or to the first metal layer to provide electrical access to the completed electrical component. The devices formed by this alternate embodiment of the present invention can then be electrically connected to other devices as desired.

Depending upon the predetermined patterns of the first and second electrically conductive layers, the microcomponents formed by the process of the present invention can be, for example, microinductors, microtransformers and/or microautotransformers. In addition, although the above summary describes the fabrication of microcomponents having laminated magnetic cores, they can be fabricated with solid magnetic cores or without magnetic cores.

DETAILED DESCRIPTION OF THE PREFERRED EMBODIMENTS

Figure 1A:
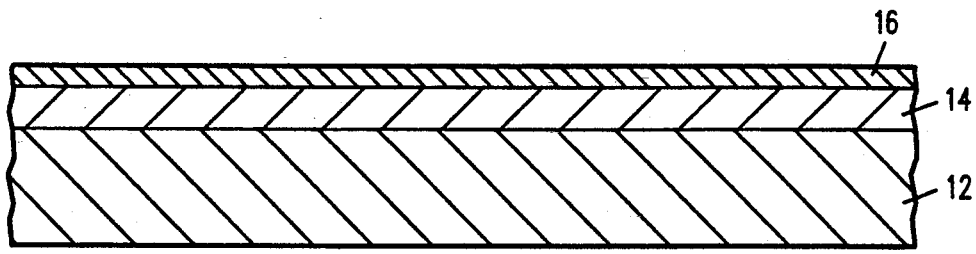
FIGS. 1A through 1M depict, in cross section and plan view, various steps of the fabrication of a microtransformer in accordance with the present invention.

The various stages of the processing of a microtransformer on a integrated circuit in accordance with the present invention are depicted in FIGS. 1A through 1M. Referring now to FIG. 1A, there is schematically depicted, in cross section, a substrate 12, for example a silicon substrate having active devices (not shown) formed therein. It should be noted that the substrate 12 could be any type of material which could be used to make active devices, for example gallium arsenide or aluminum oxide. It should also be noted that substrate 12 could also comprise a substrate of insulating material for supporting the devices formed in accordance with the present invention. In this alternate embodiment of the present invention, the components formed as hereinafter described can be electrically connected to semiconductor devices and/or other components as necessary to construct the desired circuits.

Figure 1B:
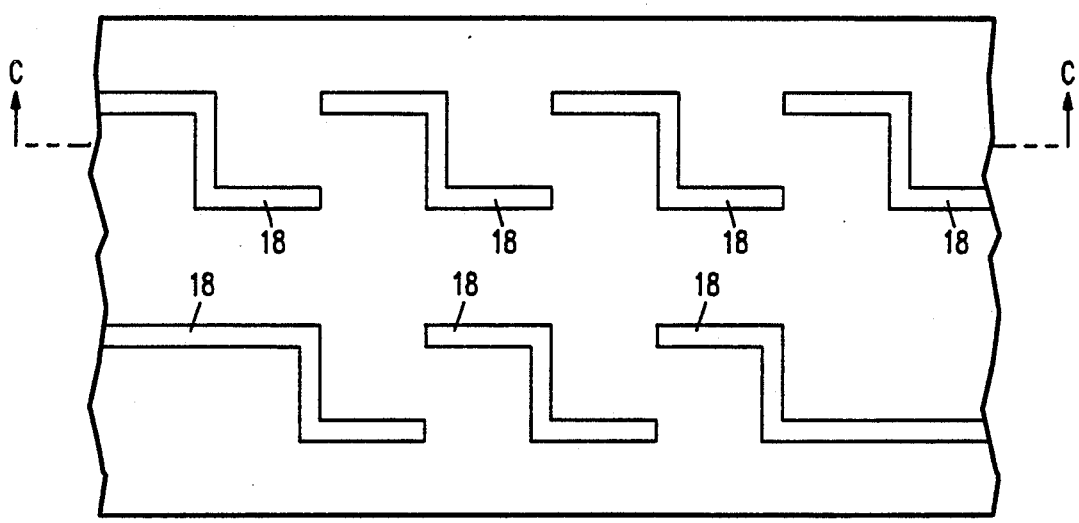
Figure 1C:
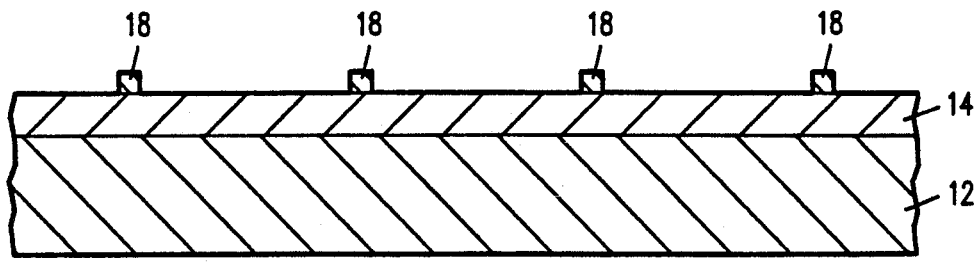

A layer 14 of insulating material, for example silicon dioxide, is formed over the silicon substrate 12, to a thickness preferably of about 10,000 Å (1 micron) preferably by plasma enhanced chemical vapor deposition (PECVD). At least one opening (not shown) is formed in the insulating layer 14 to expose predetermined electrical contact areas on the upper surface of the silicon substrate 12. The openings are preferably defined using a known photoresist method, then etched using an etchant which attacks the insulating material but which is unreactive with and stops at the underlying layer. In the embodiment where the microcomponents of the present invention are formed on an insulating substrate, neither the layer of insulating material 14 nor the openings in this layer are required. In such an embodiment, it is preferred that contacts to the microcomponents be made through the upper most insulating layer. A first layer 16 of an electrically conductive material, such as aluminum or a tungsten alloy, is formed over the first insulating layer 14 into the openings formed therein and into contact with the exposed contact areas, preferably by sputtering the aluminum to a predetermined thickness in the range of from about 3,000 Å to about 15,000 Å (1.5) microns), preferably to a thickness of approximately 7,500 Å. Referring now to FIG. 1B, the first electrically conductive layer 16 is formed into a predetermined pattern of electrically conductive segments 18 using, for example, known photoresist and etching techniques. FIG. 1C is a cross section through line C—C of FIG. 1B.

Figure 1D:
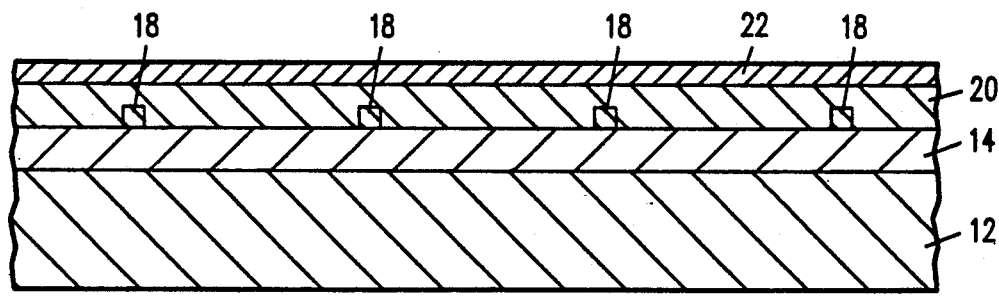
Figure 1E:
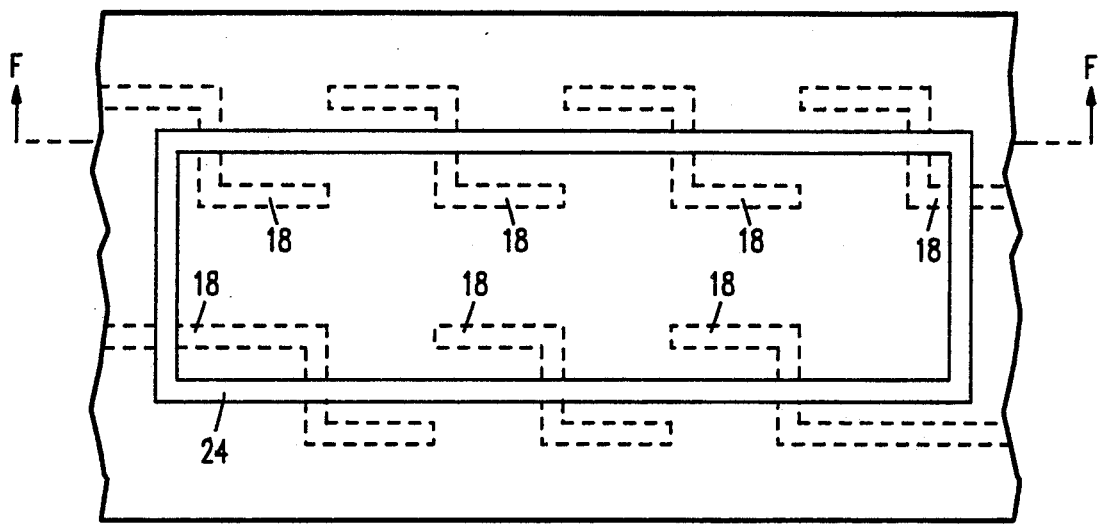
Figure 1F:
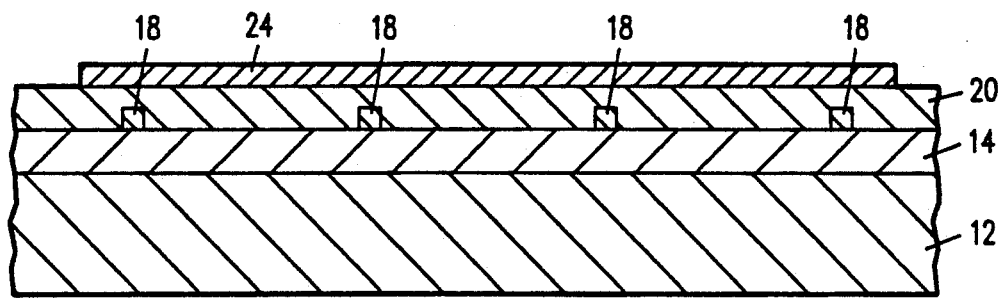

Referring now to FIG. 1D, a second layer 20 of insulating material, for example silicon dioxide, is formed over the first insulating layer and the electrically conductive segments 18 to a thickness of approximately 10,000 Å preferably by PECVD. A first layer 22 of magnetic material, such as iron, nickel or an iron-nickel alloy, is disposed over the second insulating layer 20 to a thickness of approximately 5,000 Å preferably by sputtering. The magnetic material could also be an insulating magnetic material such as, for example, a ferrite material which is useful for reducing losses at higher frequencies. The first layer of magnetic material 22 is formed into a predetermined pattern having a predetermined positional relationship with respect to the underlying segments 18 of electrically conductive material using, for example, known photoresist and etching techniques. One embodiment of this predetermined pattern 24 is depicted in FIG. 1E. As can be seen in FIG. 1E, the predetermined pattern 24 of the magnetic material is preferably rectangular in shape. Two opposing sides of the rectangular shaped pattern 24 are positioned over the underlying segments 18 in substantially bisecting relationship thereto. The reason for this positional relationship between the patterned magnetic material 24 and the underlying segments 18 will become apparent later on in this detailed description. FIG. 1F is a cross sectional view taken along lines F—F of FIG. 1E.

Figure 1G:
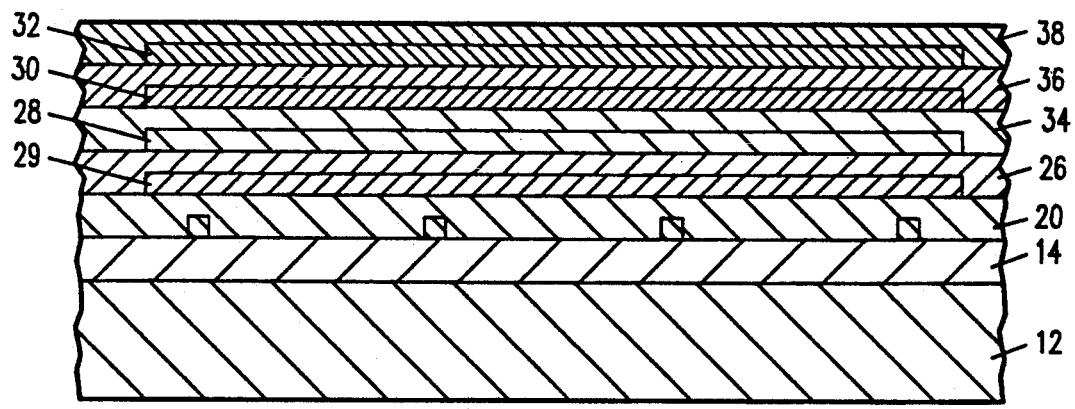

Referring now to FIG. 1G, a third electrically insulating layer 26, preferably comprising SiO$_2$, is formed over the second electrically insulating layer 20 and the first patterned magnetic layer 24 preferably by PECVD to a thickness of layer 26 is approximately 10,000 Å. Additional layers of patterned magnetic material are formed as required to reduce magnetic losses, each of which is formed preferably by sputtering and each of which has a thickness of approximately 5,000 Å. Each layer of patterned magnetic material is covered by a layer of electrically insulating material, preferably SiO$_2$. Each layer of electrically insulating material is preferably formed by PECVD to a thickness of approximately 10,000 Å. in the embodiment depicted in FIG. 1G, there are three additional layers 28, 30 and 32 of patterned magnetic material; each of which has a layer of electrically insulating material, 34, 36 and 38 respectively, formed thereover. The additional layers of patterned magnetic material each has substantially the same pattern and is substantially aligned with the underlying patterned magnetic material.

Figure 1H:
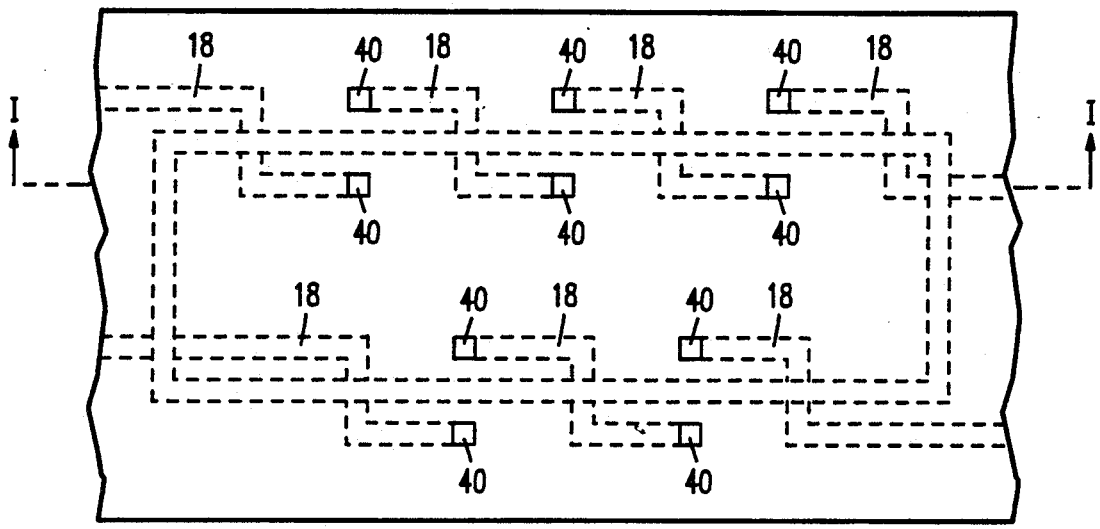
Figure 1I:
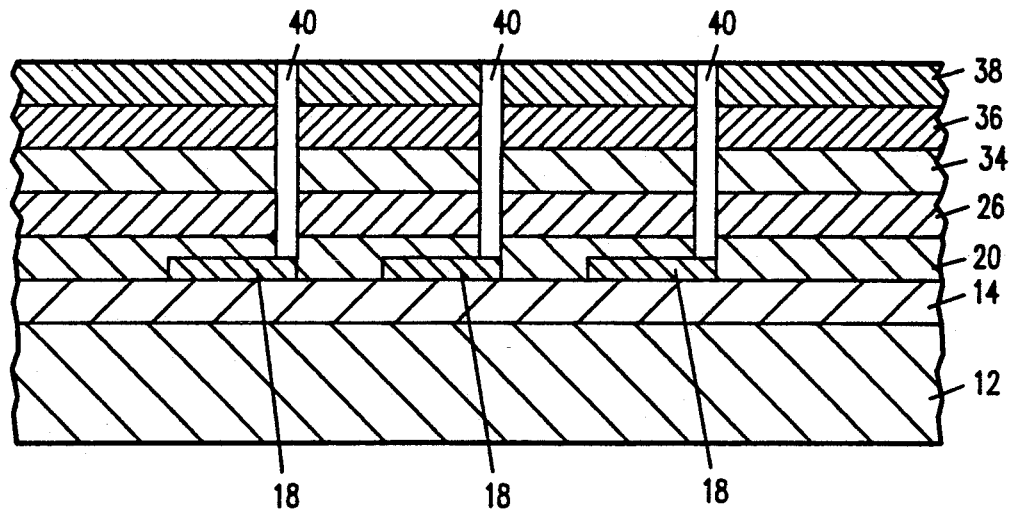

Referring now to FIGS. 1H and 1I, vias 40 are opened through the insulating layers 20, 26, 34, 36 and 38 to expose electrical contact areas on the underlying patterned segments 18. The vias are opened using known photoresist and etching techniques. That is, for example, the openings are defined using a known photoresist method, then etched using an etchant which etches the insulating material but which stops on the surface of the underlying patterned segments 18. In those embodiments where the via openings are deep, for example, deeper than approximately 3 microns, the openings can be formed in each insulating layer following the formation of such layer or can be formed in groups of insulating layers (depending upon the thickness of each insulating layer) in order to prevent the etch depth from becoming excessive. The exposed electrical contact areas are preferably at the ends of the segments 18 for reasons which will become apparent later on in this detailed description. A nucleating layer of material, such as titanium/tungsten (TiW) is disposed over the sixth insulating layer 18 into the vias 40 and into electrical contact with the electrical contact areas exposed on the underlying segments 18. In the preferred embodiment, the nucleating layer is formed by sputtering the TiW material to a thickness of approximately 1,000 Å.

Figure 1J:
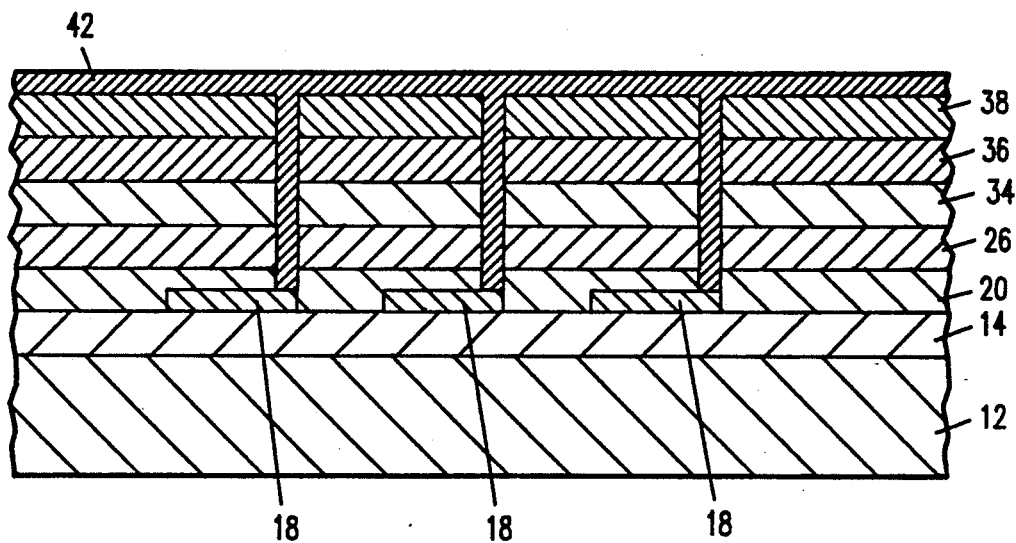
Figure 1K:
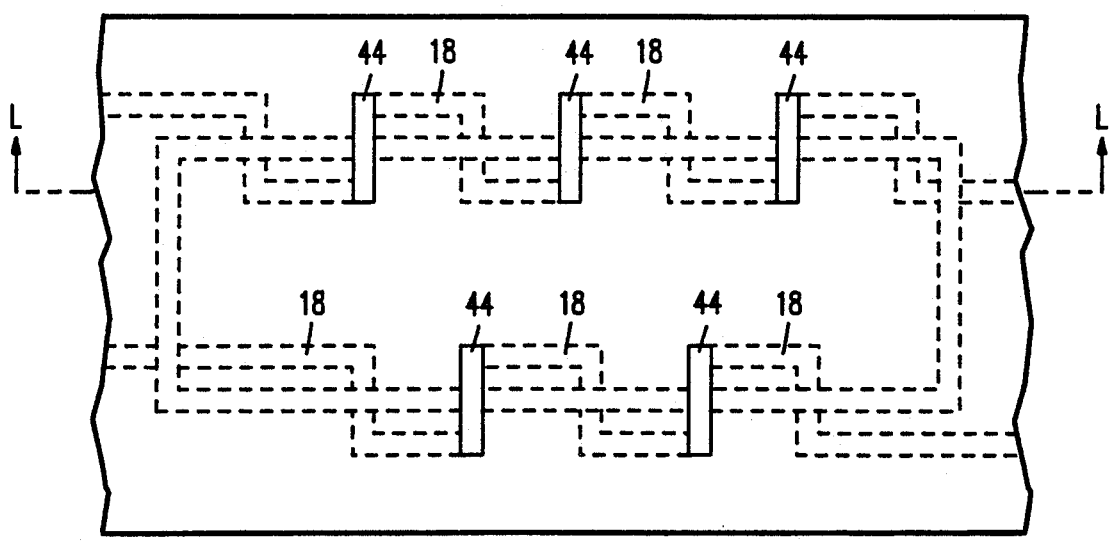
Figure 1L:
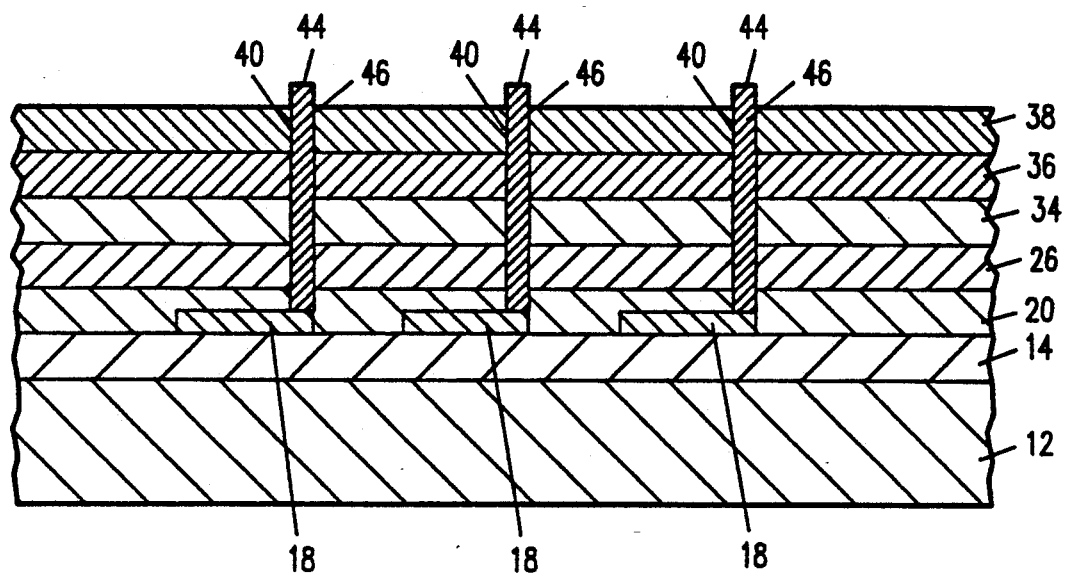
Figure 1M:
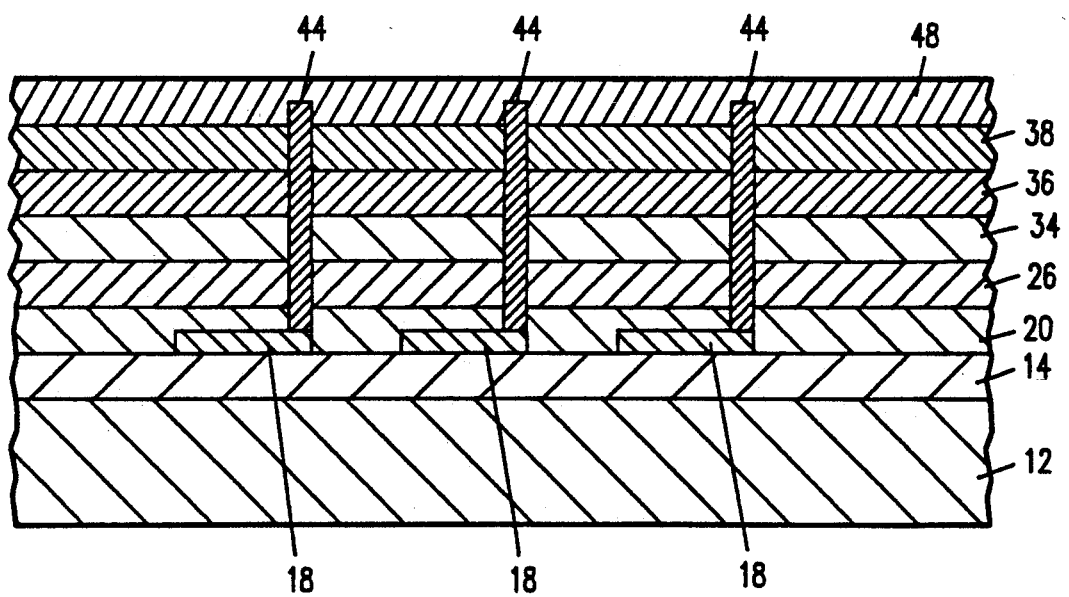

Referring to FIG. 1J, a second layer 42 of electrically conductive material, such as tungsten, is disposed over the nucleating layer previously disposed over the sixth insulating layer 38 into the vias 40 and into electrical contact with the electrical contact areas exposed on the underlying segments 18 through the nucleating layer. The second layer 42 is preferably formed by CVD to a thickness of approximately 7,500 Å. The second layer 42 of electrically conductive material is patterned into electrically conductive segments 44 as shown in FIGS. 1K and 1L, preferably using known photoresist and etching techniques. In the preferred embodiment shown in FIG. 1L, the end of each electrically conductive segment 44 terminates in an electrically conductive vertical member 46 which extends down through the via 40 into contact with the underlying electrically conductive segment 18. As shown in FIG. 1M, a layer 48 of electrically insulating material, such as silicon dioxide, phosphosilicate glass (PSG), undoped silicate glass (USG), or silicon nitride is disposed over the sixth layer 38 of insulating material and the electrically conductive segments 44 preferably by PECVD to a thickness of approximately one micron, to passivate the device from external attack.

Figure 2:
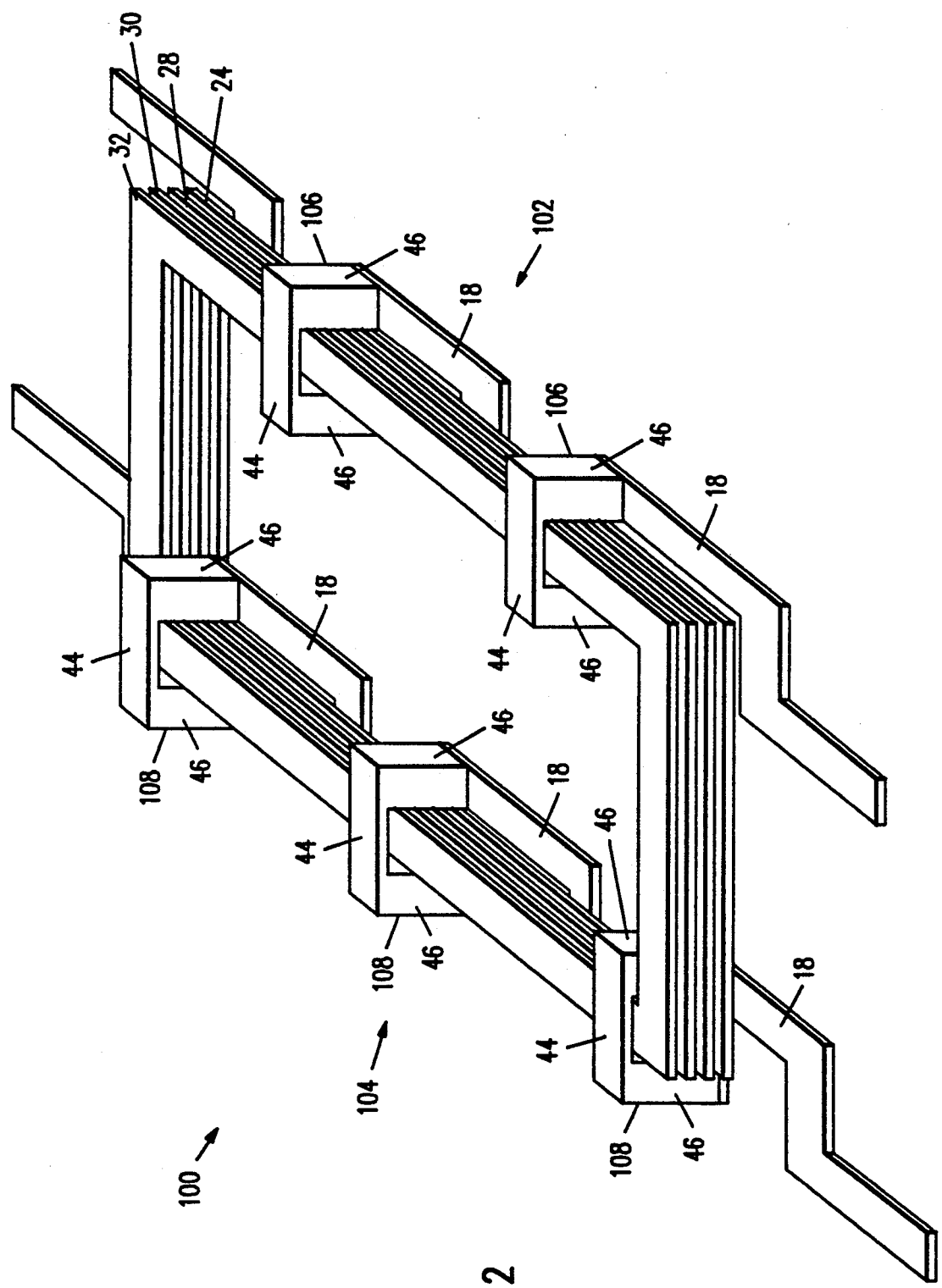
FIG. 2 is a schematic, perspective view of the coils and magnetic core portions of the microtransformer fabricated in accordance with the steps depicted in FIGS. 1A through 1M.

Referring now to FIG. 2, there is depicted, schematically in perspective, the transformer which has been formed in accordance with the method described above. As can be seen in FIG. 2, the transformer 100 comprises a primary segment 102 and a secondary segment 104. The primary segment 102 comprises a plurality of coils 106 (two are shown for example in FIG. 2) each of which is formed by a portion of two electrically conductive segments 18, two vertically conductive members 46 and one electrically conductive segment 44. Each coil surrounds a portion of the patterned magnetic segments 24, 28, 30 and 32 as a result of the predetermined positional relationship between the patterned magnetic material and the underlying segments 18; the positioning of the vias 40; and the predetermined positional relationship between the segments 44, the vias 40 and the underlying segments 18 as shown in FIGS. 1L–1M. The secondary portion 104 of the transformer 100 is formed of a plurality of coils 108 (three are shown for example in FIG. 2) comprising portions of electrically conductive segments 18, vertical electrically conductive segments 46 and electrically conductive segments 44 which surround a portion of the patterned magnetic layers 24, 28, 30 and 32.

Although, in the embodiment depicted in FIG. 2 there are two coils in the primary and three coils in the secondary, the electrically conductive layers 16 and 42 and the vias 40 can be patterned to accommodate different number of primary and secondary coils as required by the desired electrical characteristics of a particular transformer. It should also be noted that although the preferred embodiment described above includes a laminated core of magnetic material, the core could consist of a single layer of magnetic material or the transformer could be constructed without a core of magnetic material and these alternate embodiments are considered to be within the scope of contemplation of the present invention. It should be further noted that, although the process described in this detailed description utilizes thin film technology for constructing the inductive microcomponents, including microtransformers, microautotransformers and microinductors; in accordance with the present invention; thick film technology, for example forming the metal layers by plating, can also be effectively employed.

The transformer depicted in FIG. 2 has been constructed such that the axis of primary and secondary coils are substantially parallel with respect to the surface of the underlying substrate. In this configuration, the transformer spreads out over the surface of the substrate and could occupy a relatively substantial portion of real estate of the integrated circuit depending upon the number of coils in the primary and/or secondary and/or the positional relationship between the primary and secondary. In order to conserve the area occupied by the device, it could be constructed such that the axes of the coils are substantially perpendicular to the surface of the underlying substrate, for example as shown schematically in perspective in FIG. 3. In the configuration depicted in FIG. 3, the axis of the primary coils 106 and the secondary coils 108 are substantially perpendicular to the underlying substrate (not shown). Two segments, 110 and 112, of the magnetic core 114 extend through the primary 106 and secondary 108 coils respectively in a direction which is substantially perpendicular to the underlying substrate. The other two segments, 116 and 118 of the coil 114 connect the first two segments 110 and 112 and extend in a direction which is substantially parallel to the underlying substrate.

Figure 3:
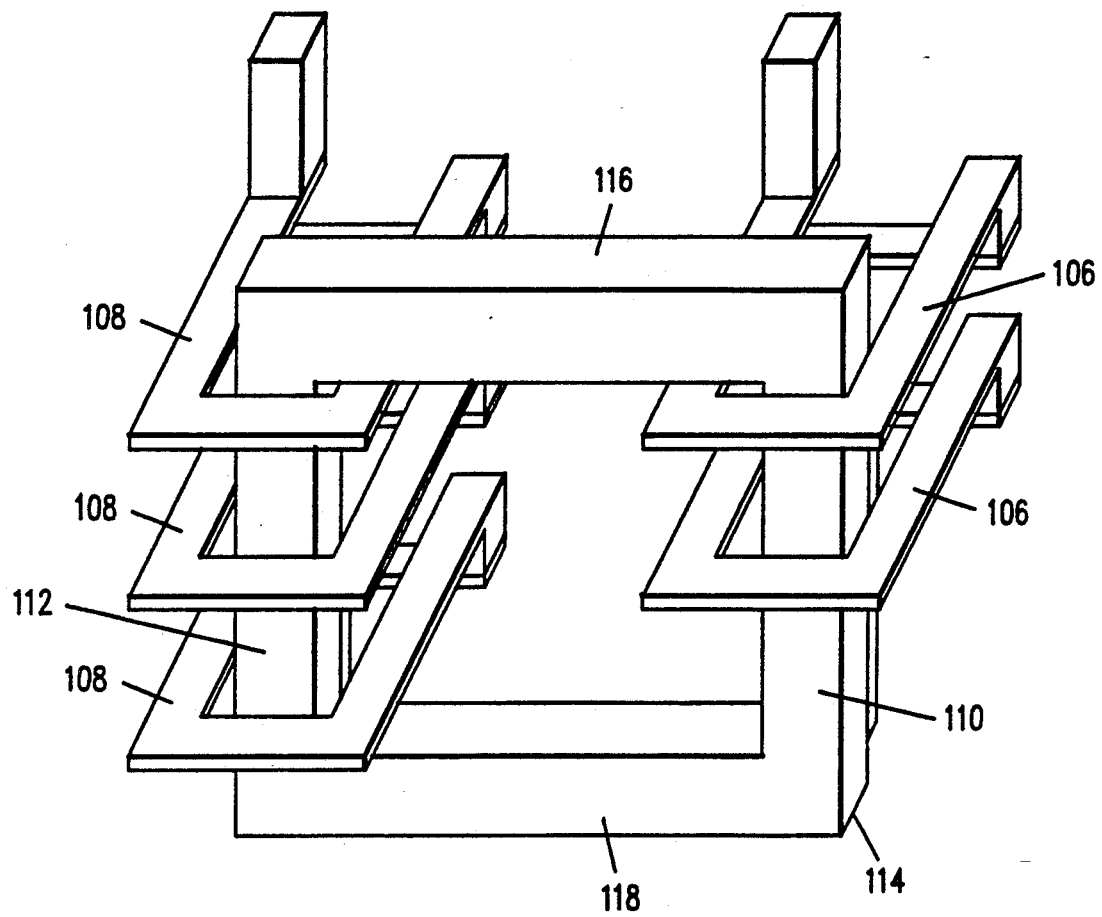
FIG. 3 is a schematic, perspective view of the coils and magnetic cores portions of an alternate embodiment of a microtransformer in accordance with the present invention in which the axes of the coils are substantially perpendicular to the surface of the underlying substrate.
Figure 4A:
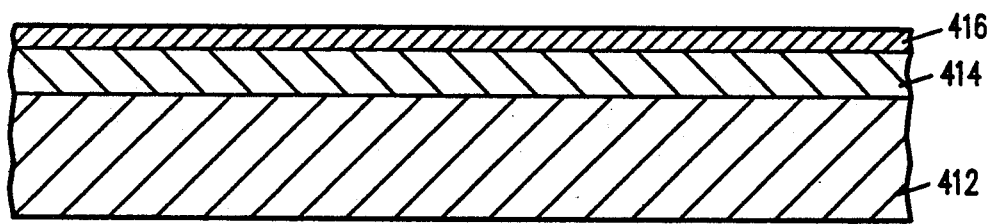
FIGS. 4A through 4R depict, in cross section and plan view, various steps of the fabrication of an exemplary group of four microtransformers of the type depicted in FIG. 3.
Figure 4B:
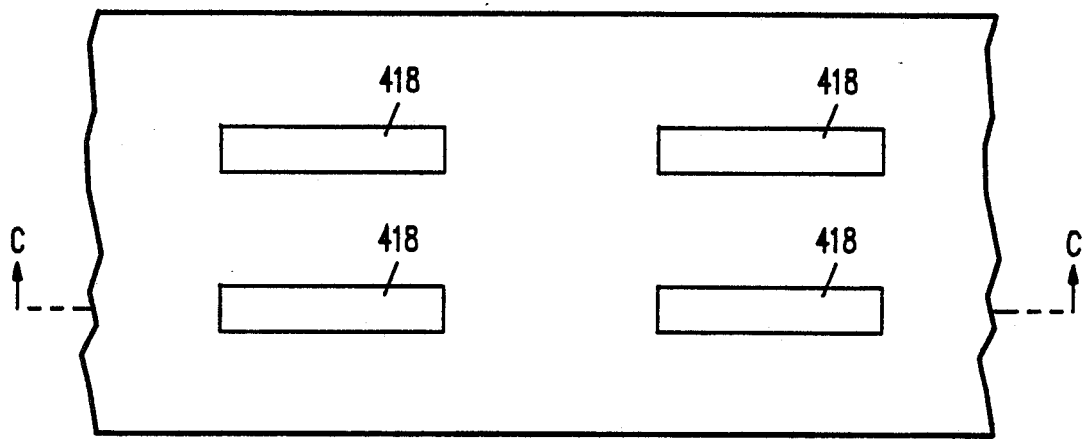
Figure 4C:
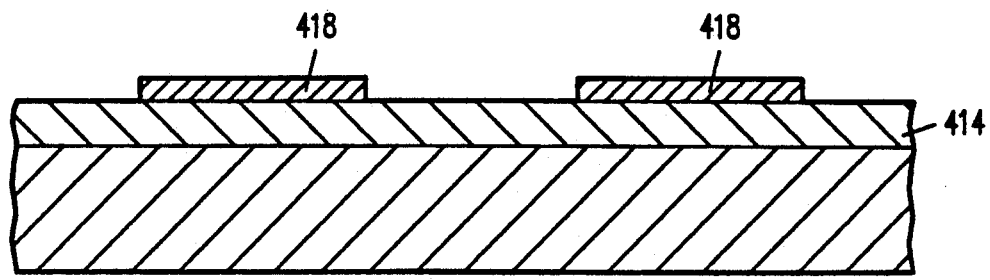
Figure 4D:
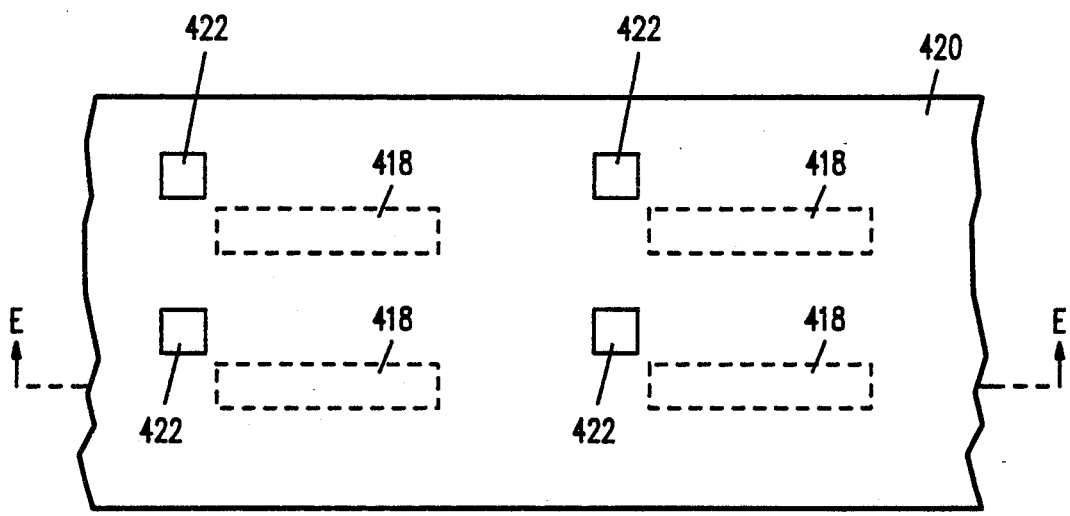
Figure 4E:
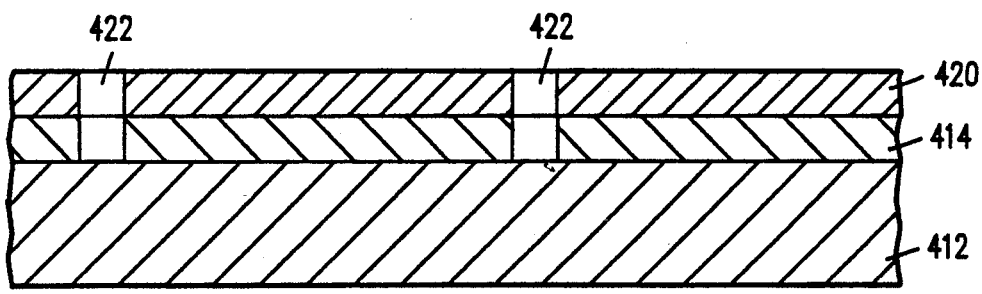
Figure 4F:
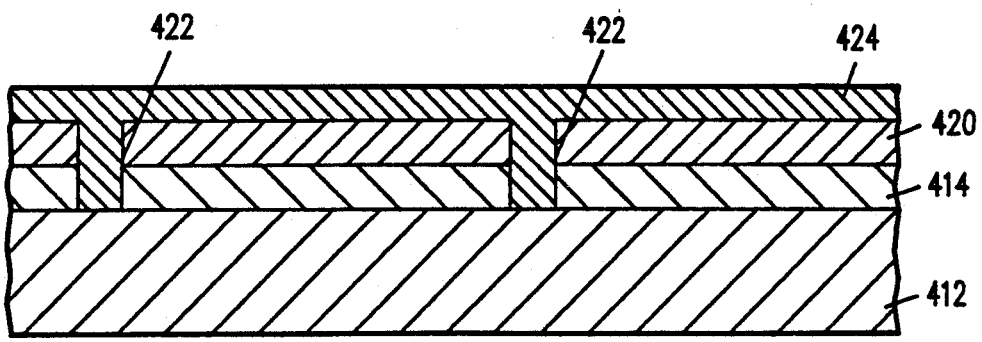
Figure 4G:
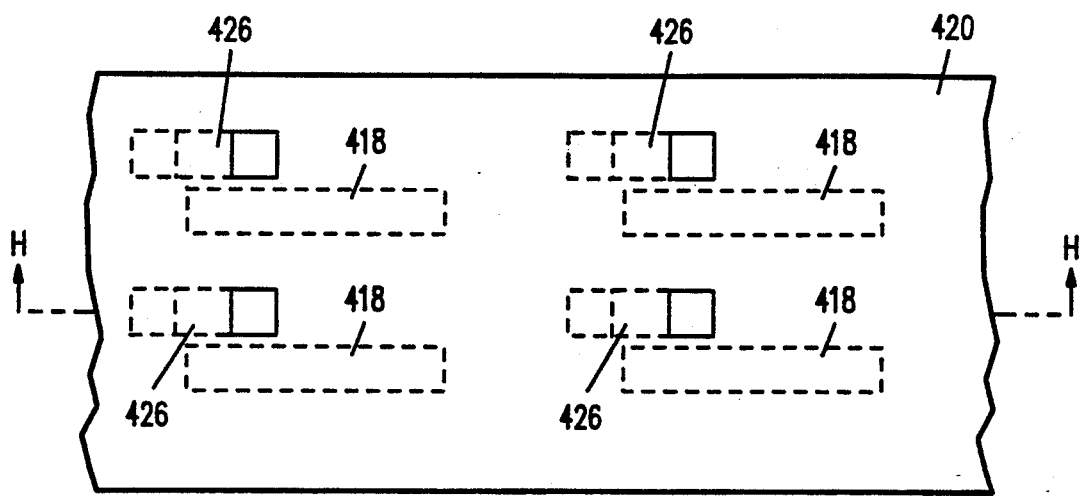
Figure 4H:
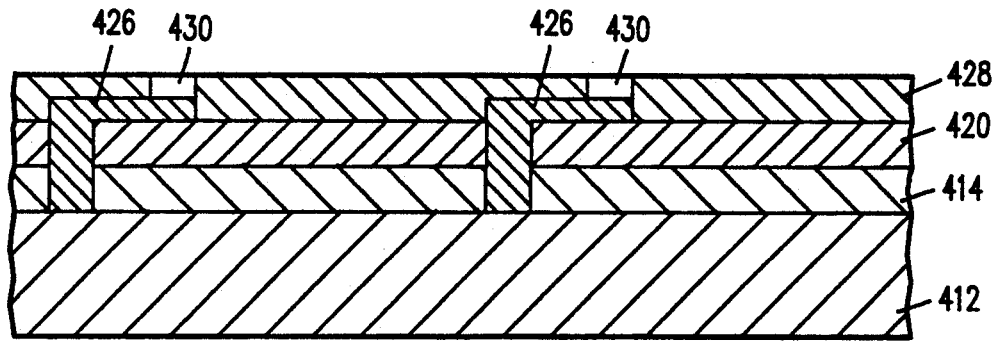
Figure 4I:
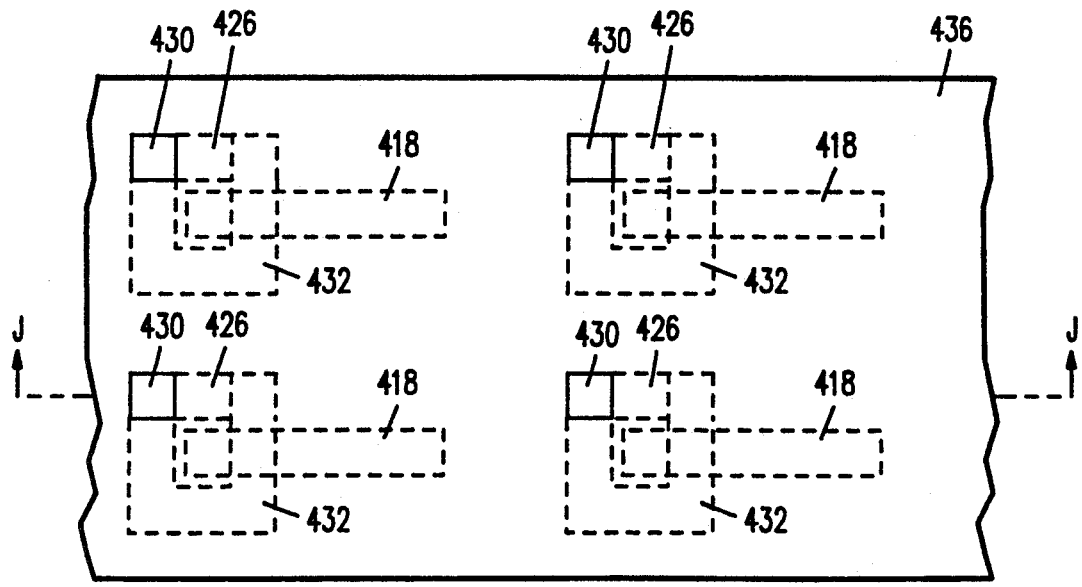
Figure 4J:
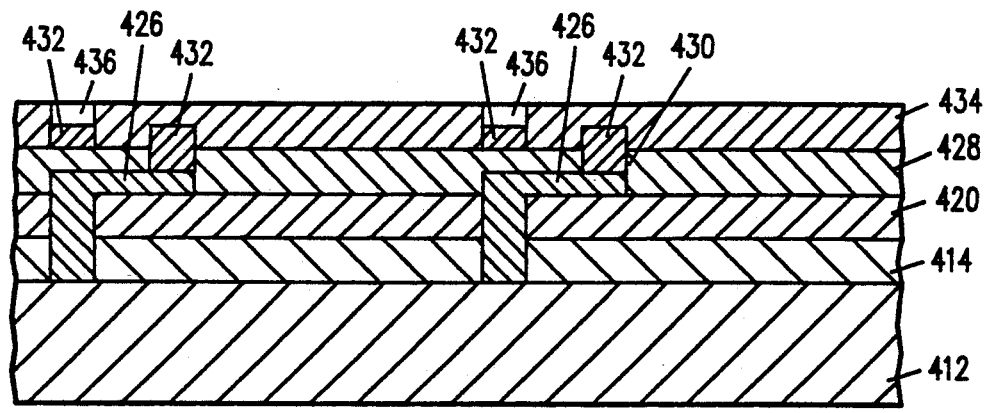
Figure 4K:
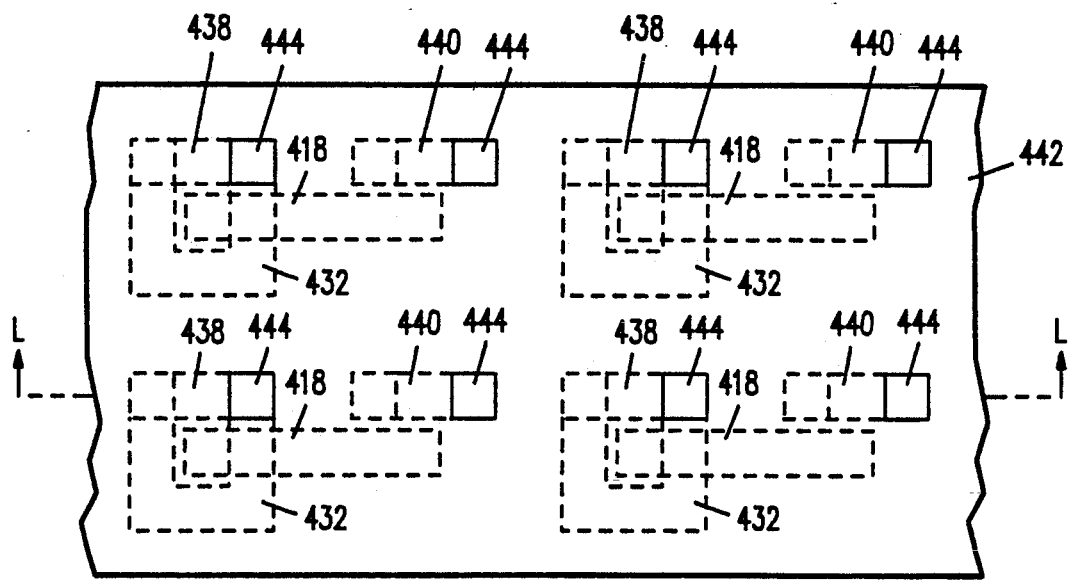
Figure 4L:
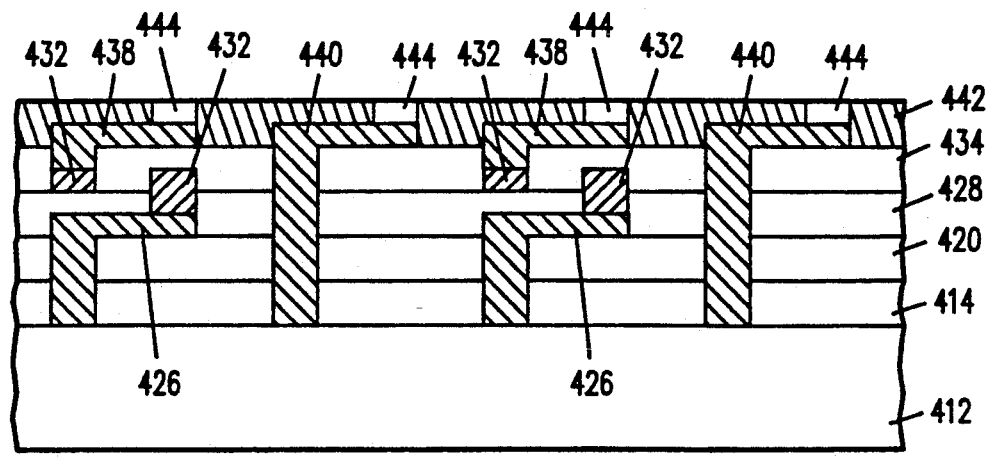
Figure 4M:
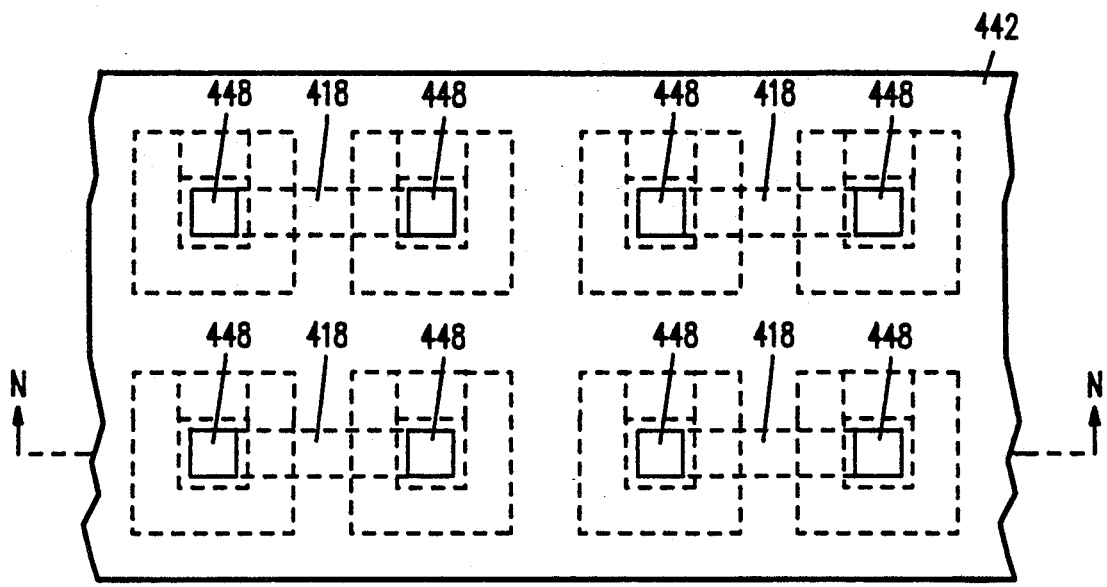
Figure 4N:
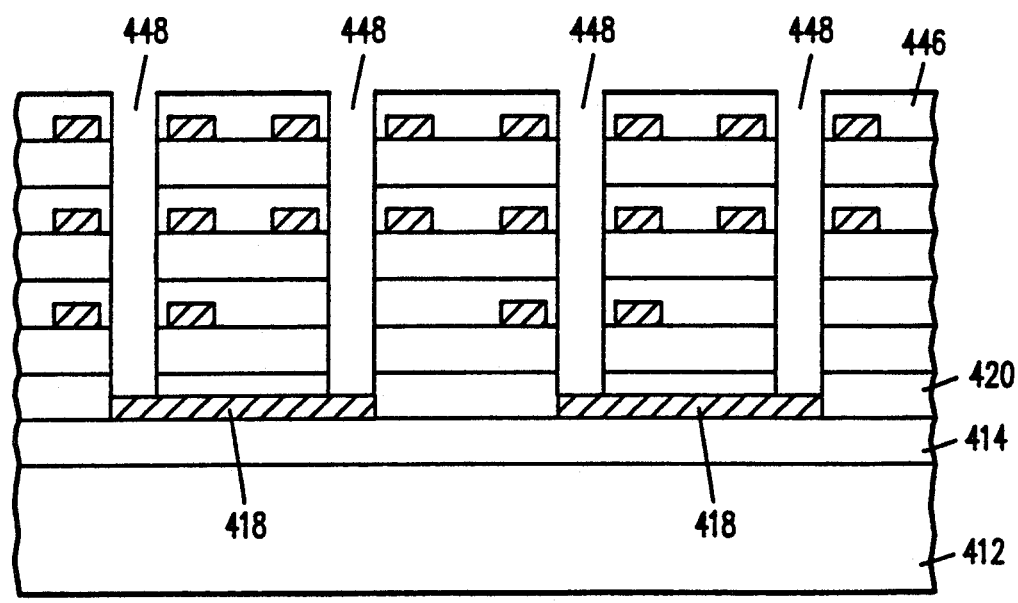
Figure 4O:
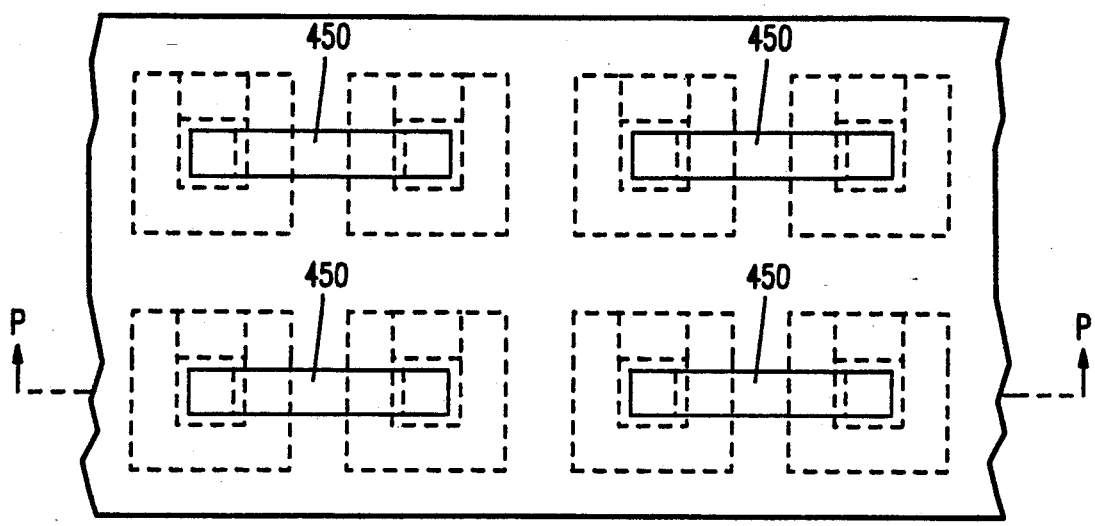
Figure 4P:
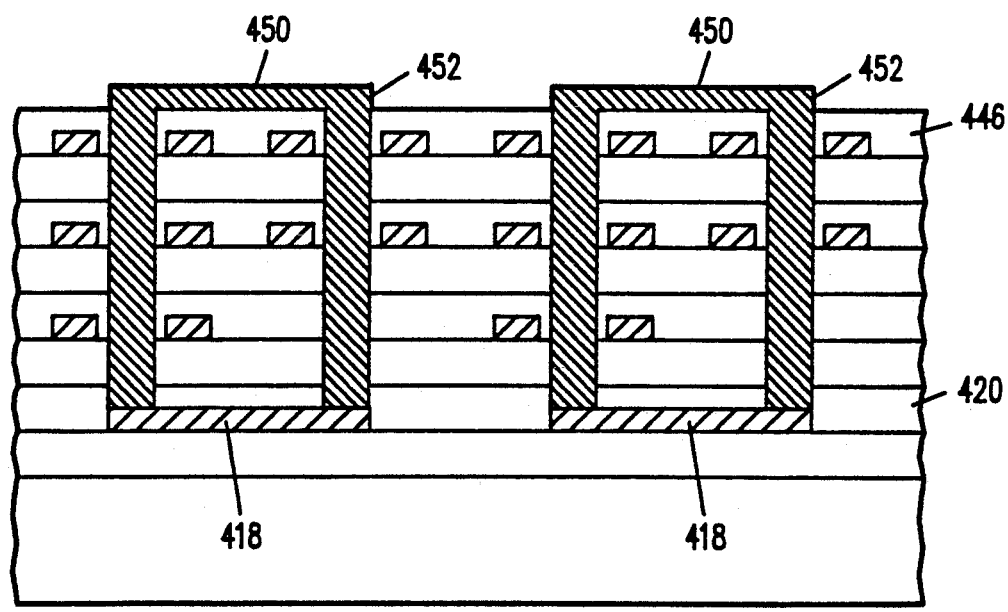
Figure 4Q:
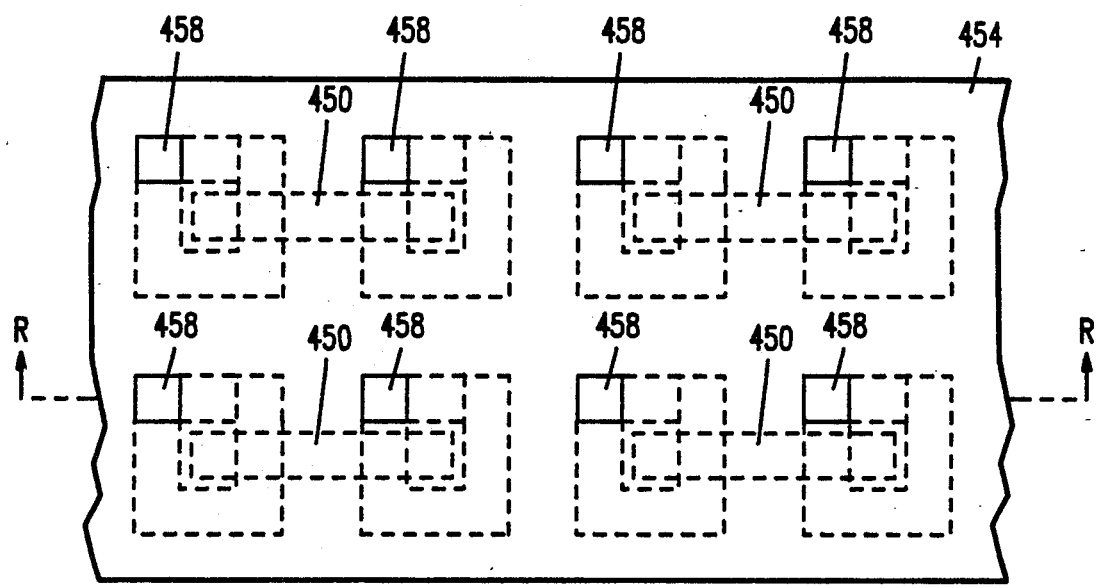
Figure 4R:
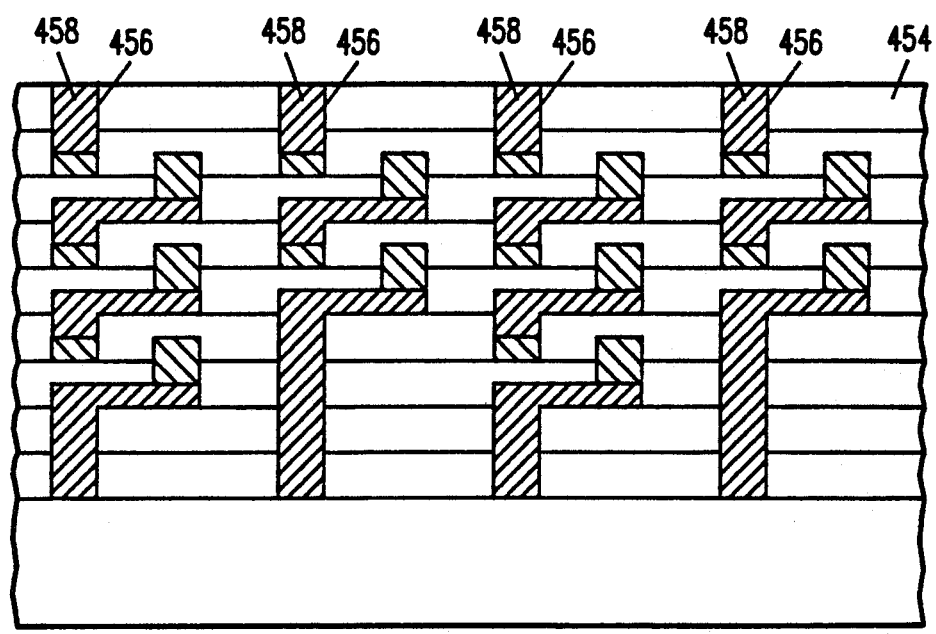

The various stages of the processing of a microtransformer on an integrated circuit in accordance with the embodiment of the present invention depicted in FIG. 3 are shown in FIGS. 4A through 4R. The methods employed for forming the various layers, the thicknesses of the layers, and the methods employed for forming the vias and the predetermined patterns in the electrically conductive and magnetic layers are preferably the same as those described above in connection with FIGS. 1A–1M. Referring now to FIG. 4A, there is schematically depicted, in cross section, a substrate 412, for example a silicon substrate having active devices (not shown) formed therein. The substrate 412 can be any type of material which could be used to make active devices for example, silicon or gallium arsenide; or just a passive substrate like aluminum oxide. It should be noted that substrate 412 could also comprise a substrate of insulating material for supporting the devices formed in accordance with the present invention. In this alternate embodiment of the present invention, the components formed can be electrically connected to semiconductor devices and/or other components as necessary to construct the desired circuits.

A layer 414 of insulating material, for example silicon dioxide, is formed over the silicon substrate 412. In the embodiment where the microdevices of the present invention are formed on an insulating substrate, the layer 414 of insulating material is not required. A first layer 416 of magnetic material, such as iron, nickel or an iron-nickel alloy, is disposed over the first insulating layer 414. The magnetic material could also be an insulating magnetic material such as, for example, a ferrite material which is useful for reducing losses at higher frequencies. The first layer of magnetic material 416 is formed into a predetermined pattern having a predetermined positional relationship with respect to the underlying active devices (not shown) using, for example, known photoresist and etching techniques. One form of this predetermined pattern is shown in plan view in FIG. 4B and in cross sectional view in FIG. 4C. The segments 418 of the predetermined pattern of magnetic material each forms a lower segment of a magnetic core corresponding to segment 118 of the transformer depicted in FIG. 3.

Referring now to FIG. 4D and to FIG. 4E, which is a cross section of FIG. 4D through lines E—E, a second electrically insulating layer 420 is formed over the first electrically insulating layer 414 and the first patterned magnetic layer 418. Openings, or vias 422, are formed in the electrically insulating layers 414 and 420 to expose predetermined electrical contact areas on the upper surface of the silicon substrate 412. The vias 422 are formed using, for example, known photoresist and etching techniques. A first layer 424 of an electrically conductive material, such as aluminum, is formed over the second insulating layer 420 into the vias 422 and into contact with the exposed contact areas on the surface of the semiconductor substrate 412.

Referring now to FIG. 4G and to FIG. 4H which is a cross section of FIG. 4G through lines H—H, the first electrically conductive layer 424 is formed into a predetermined pattern of segments 426 using, for example, known photoresist and etching techniques. The segments 426 form a portion of the bottom coil 108 of the transformer depicted in FIG. 3. A third electrically insulating layer 428 is formed over the segments 426 and the second electrically insulating layer 420. Vias 430 are formed in the third electrically insulating layer 428 to expose contact areas on the underlying segments 426; for example, at one end of each segment 426 as shown in FIGS. 4G and 4H. The vias 430 are formed using, for example, known photoresist and etching techniques.

A second layer of an electrically conductive material such as aluminum, is formed over the fourth insulating layer 428 into the vias 430 and into contact with the exposed areas on the underlying segments 426. The second electrically conductive layer is formed into a predetermined pattern of segments 432, as shown in FIG. 4I and in FIG. 4J which is a cross section of 4I taken along lines J—J. The predetermined pattern of segments 432 is formed using, for example, known photoresist and etching techniques. A fourth insulating layer 434 is formed over the segments 432 and the third insulating layer 428. Vias 436 are formed in the fourth insulating layer 434 exposing contact areas on the underlying segments 432. The vias 436 are formed using, for example, known photoresist and etching techniques. Each segment 432 corresponds to a segment of the lower coil 108 of a transformer of the type depicted in FIG. 3.

Referring now to FIG. 4K and to FIG. 4L which is a cross section of FIG. 4K taken along lines L—L, a third layer of an electrically conductive material, such as aluminum, is formed over the fourth insulating layer 434 into the vias 436 into contact with the exposed areas on the underlying segments 432. The third electrically conductive layer is formed into a predetermined pattern of electrically conductive segments 438 and 444 using, for example, known photoresist and etching techniques. Each of the segments 438 corresponds to a portion of the middle coil 108 of the secondary of the microtransformer depicted in FIG. 3. Each of the segments 440 corresponds to a portion of the lower coil 106 of the primary of the microtransformer depicted in FIG. 3. This process is continued until segments which correspond to portions of the top coils of the primary and secondary coils of the microtransformer, for example, the top coils of the primary 106 and secondary 108 of the microtransformer depicted in FIG. 3 have been constructed. A top layer 446 (see FIGS. 4M and 4N) of electrically insulating material such as silicon dioxide is formed over the segments corresponding to the top coils of the primary 106 and secondary 108 of the microtransformer depicted in FIG. 3.

Referring to FIG. 4M and to FIG. 4N which is a cross section of FIG. 4M taken along lines N—N, vias 448 are formed through the insulating layers 446 down through 420 to expose contact areas on the underlying segments 418 of magnetic material, preferably at the ends of each segment 418. In those embodiments where the vias 448 are deep, for example deeper than approximately 3 microns, the vias 448 can be formed in each insulating layer following the formation of such layer or can be formed in groups of insulating layers (depending upon the thickness of each insulating layer) in order to prevent the etch depth from becoming excessive.

A second layer of magnetic material, preferably the same material as that of the first layer 416 of magnetic material, is formed over the top insulating layer 446 into the vias 448 in contact with the exposed areas of the underlying magnetic segments 418. Once again, if the number and thickness of the overlying insulating layers is such that formation of the magnetic material into the vias 448 and into contact with the underlying segments 418 becomes difficult or impractical, segments of the vertical portions (posts) of magnetic material can be formed into vias which are formed into individual insulating layers of groups of insulating layers depending upon the thicknesses. The second layer of magnetic material is formed into a predetermined pattern having a predetermined positional relationship with respect to the vertical segments (posts) of magnetic material and the underlying segments 418 of magnetic material such that resultant is a closed core of magnetic material as shown FIG. 4O and in FIG. 4P which is a cross section of FIG. 4O taken through lines P—P.

Referring now to FIG. 4Q and to FIG. 4R which is a cross section of FIG. 4Q taken through lines R—R, a final layer 454 of electrically insulating material such as silicon dioxide is formed over the top insulating layer 446 and the magnetic segments 450. Vias 456 are formed in the final insulating layer 454 to expose contact areas on the underlying segments of the top coils of the microtransformers. A final layer of electrically conductive material, for example aluminum, is formed over the final insulating layer 454 into the vias 456 into contact with the exposed areas on the underlying segments. The final layer of electrically conductive material can be etched back to the surface of the final insulating layer 454 in order to form contact posts 458, the tops of which are substantially co-planar with the surface of final layer 454. However, it is preferred that the final electrically conductive layer be patterned and formed into interconnects as desired to interconnect the microtransformers and/or other devices.

Figure 5:
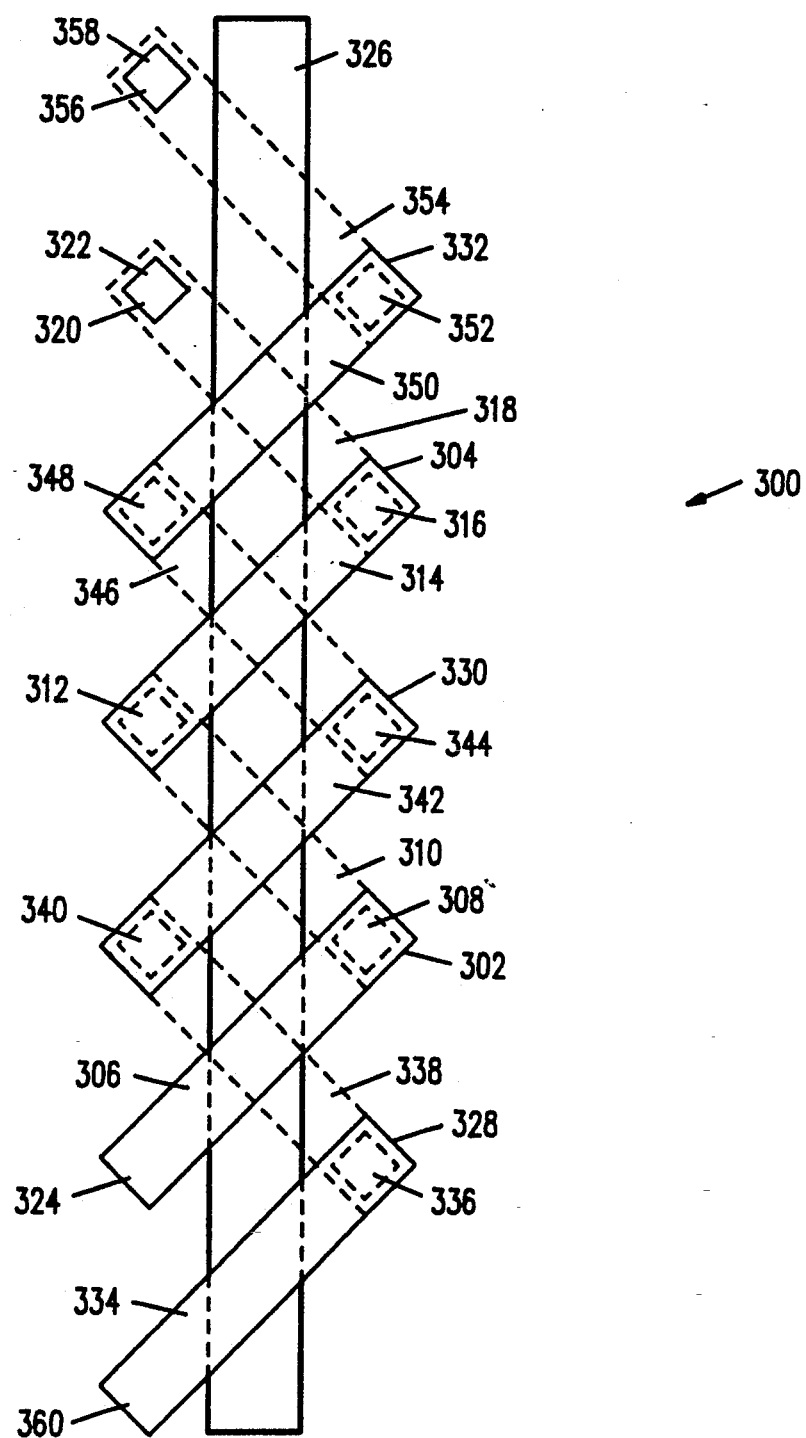
FIG. 5 is a schematic, plan view of another alternate embodiment of microtransformer in accordance with the present invention.

Referring now to FIG. 5, there is shown an alternate embodiment of a microtransformer in accordance with the present invention, generally designated 300. The microtransformer 300 comprises a plurality of primary coils. Two primary coils 302 and 304 are shown for example in FIG. 5. In the configuration depicted in FIG. 5, the first primary coil 302 comprises an upper horizontal segment 306; a first vertical segment 308; a lower horizontal segment 310; and a second vertical segment 312. Similarly, the second primary coil 304 comprises an upper horizontal segment 314; a first vertical segment 316; a lower horizontal segment 318; and a second vertical segment 320, all of which are electrically connected in series. Accordingly, the electrical circuit between the upper portion of the second vertical segment 320, designated electrical contact 322; and the end of the upper horizontal segment 306 opposite the end electrically contacting the upper portion of the vertical segment 308, designated electrical contact 324, includes two electrically conductive loops which surround, in the embodiment depicted in FIG. 5, a magnetic core 326.

The secondary portion of the exemplary transformer 300 depicted in FIG. 5 comprises three secondary coils 328, 330 and 332. The first secondary coil 328 comprises an upper horizontal segment 334; a first vertical segment 336; a lower horizontal segment 338; and a second vertical segment 340. The second secondary coil 330 comprises an upper horizontal segment 342; a first vertical segment 344; a lower horizontal segment 346; and a second vertical segment 348. The third secondary coil 332 comprises an upper horizontal segment 350; a first vertical segment 352; a lower horizontal segment 354; and a second vertical segment 356. All of the aforementioned segments are electrically connected in series. Accordingly, the electrical circuit between the upper portion of the second vertical segment 356 of the third secondary coil 332, designated electrical contact 358; and the end of the upper horizontal segment 334 of the first secondary coil 328 opposite the first vertical segment 336, designated electrical contact 360, comprises three coils which surround the magnetic core 326. It should be noted that the magnetic core 326 could be a solid piece or could comprise a lamination of layers of magnetic materials as previously described and depicted in FIG. 2; and could also take the form of a closed loop and such configurations are considered within the scope and contemplation of the present invention. Furthermore, the magnetic core 326 could be eliminated entirely and such is also considered to be within the scope contemplation of the present invention.

Figure 6:
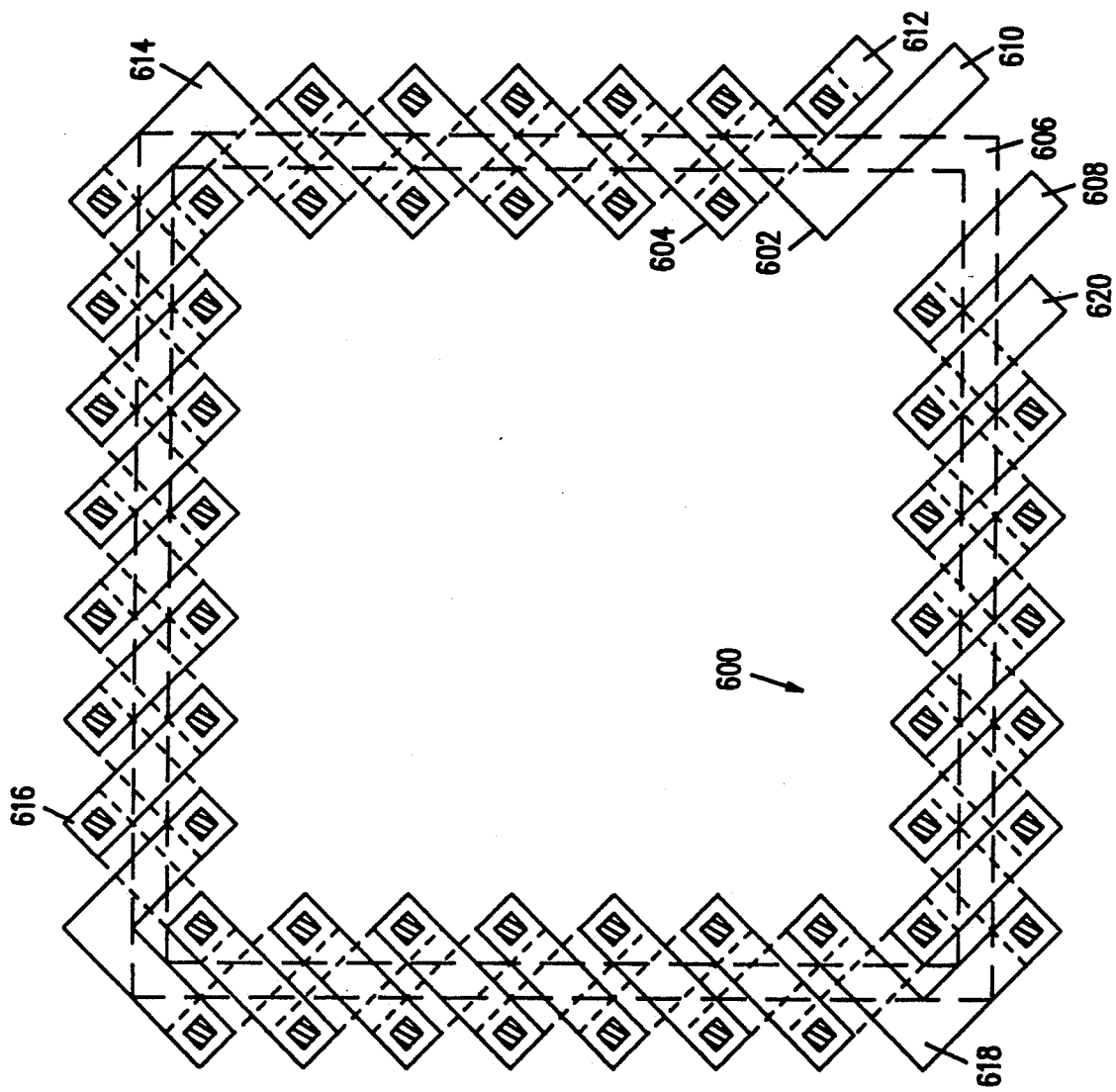
FIG. 6 is a schematic, plan view of a microautotransformer in accordance with the present invention.

Referring now to FIG. 6, there is shown an autotransformer in accordance with the present invention, generally designated 600. The autotransformer 600 comprises a plurality of primary coils 602 and secondary coils 604. The primary coils 602 and secondary coils 604 are inductively coupled by means of a magnetic core 606. The autotransformer 600 is constructed in accordance with the present invention using the process described with respect to construction of the microtransformers depicted in FIGS. 2 and 3. The magnetic core 606 can either be a solid magnetic core or it can be laminated as previously described in the detailed description. The autotransformer 600 can be constructed on a semiconductor substrate having active devices formed therein or can be formed on an insulating substrate as previously described in this detailed description.

In operation as a step down transformer, an alternating voltage is applied across contact points 608 and 610 of the primary coil 602. Secondary voltages can be tapped from the autotransformer 600 at different locations depending upon the ratio of the secondary voltage to the primary voltage desired. For example, the secondary voltage between contact points 612 and 614 of the secondary coils 604 will have a magnitude which is one-quarter the magnitude of the voltage input across the primary coils between contact points 608 and 610. Similarly the voltage output between contact points 612 and 616 of the secondary coils 604 will be one-half the magnitude of the primary voltage across contacts 608 and 610. The voltage across contact points 618 and 612 of the secondary coils 604 will have a magnitude which is three-quarters the magnitude of the primary voltage applied across contacts 608 and 610. The magnitude of the voltage across contact points 612 and 620 of the secondary coils 604 will be substantially equal to the magnitude of the voltage applied across contact points 608 and 610 of the primary coils. In operation as a step up transformer, the input voltage can be applied across the transformer taps as desired to obtain the desired output voltage across contact points 608 and 611.

Although the above detailed description sets forth the preferred embodiment of the process for fabricating microtransformers and microautotransformers, it is apparent to those skilled in the art that microinductors, with or without magnetic cores, can also be constructed using the process of the present invention, and such is considered to be within the scope and contemplation of the present invention. For example, either the primary segment 102 or the secondary segment 104 of the transformer 100 depicted in FIG. 2 could be a micro inductor having a magnetic core which is disposed only within the coils of either the primary segment 102 or the secondary segment 104; or each could be a micro inductor without any core material within their respective coils at all.

It will be understood that various changes in the details, materials and arrangements of the parts which have been described and illustrated in order to explain the nature of this invention may be made by those skilled in the art without departing from the principle and scope of the invention as expressed in the claims.

We claim:

1. A process for fabricating discrete electrical microcomponents, said process comprising the steps of:
   a. disposing a first layer of electrically insulating material on a semiconductor substrate having active devices disposed therein;
   b. forming at least one opening in the first layer of electrically insulating material to expose at least one electrical contact area on the underlying substrate;
   c. disposing a first layer of electrically conductive material on the first layer of electrically insulating material into each opening and into electrical contact with each exposed electrical contact area on the underlying substrate;
   d. forming the first layer of electrically conductive material into a first pattern;
   e. disposing a second layer of electrically insulating material on the first layer of electrically insulating material layer and the patterned first layer of electrically conductive material layer;
   f. disposing a first layer of a magnetic material on the second layer of electrically insulating material;
   g. forming the first layer of magnetic material into a pattern in positioned relationship with respect to the underlying patterned first layer of electrically conductive material;
   h. disposing a third layer of electrically insulating material on the second layer of insulating material and the patterned first layer of magnetic material;
   i. forming at least one opening in the underlying layers of insulating material to expose at least one electrical contact area on the underlying patterned first layer of electrically conductive material;
   j. disposing a second layer of electrically conductive material on the third layer of electrically insulating material into the openings and into electrical contact with each exposed electrical contact area on the underlying patterned first layer of electrically conductive material; and
   k. forming the second layer of electrically conductive material into a second pattern in positioned relationship with respect to the underlying patterned first layer of magnetic material and the patterned first layer of electrically conductive material.

2. The process in accordance with claim 1 comprising the additional step of forming a final layer of electrically insulating material on the patterned second layer of electrically conductive material.

3. The process in accordance with claim 2 including the additional step of forming openings in the final layer of electrically insulating material to expose at least one electrical contact area on the underlying patterned second layer of electrically conductive material.

4. The process in accordance with claim 1 further including the steps of forming at least one additional layer of patterned magnetic material and underlying electrically insulating layer, which steps are performed following step h and prior to step i.

5. The process in accordance with claim 4 comprising the additional step of forming a final layer of electrically insulating material on the patterned second layer of electrically conductive material.

6. The process in accordance with claim 5 including the additional step of forming at least one opening in the final layer of electrically insulating material to expose at least one electrical contact area on the underlying patterned second layer of electrically conductive material.

7. A process for fabricating discrete electrical microcomponents, said process comprising the steps of:
   a. disposing a first layer of electrically conductive material on the surface of an electrically insulating substrate;
   b. forming the first layer of electrically conductive material into a first pattern;
   c. disposing a first layer of electrically insulating material on the surface of the electrically insulating substrate and the patterned first layer of electrically conductive material;
   d. disposing a first layer of a magnetic material on the first layer of electrically insulating material;
   e. forming the first layer of magnetic material into a pattern in positioned relationship with respect to the underlying patterned first layer of electrically conductive material;
   f. disposing a second layer of electrically insulating material on the first layer of electrically insulating material and the patterned first layer of magnetic material;
   g. forming at least one opening in the underlying layers of insulating material to expose at least one electrical contact area on the underlying patterned first layer of electrically conductive material;
   h. disposing a second layer of electrically conductive material on the third layer of electrically insulating material into each opening and into electrical contact with each exposed electrical contact areas of the underlying patterned first layer of electrically conductive material; and
   i. forming the second layer of electrically conductive material into a second pattern in positioned relationship with respect to the underlying patterned layer of magnetic material and the patterned first layer of electrically conductive material.

8. The process in accordance with claim 7 comprising the additional step of forming a final layer of electrically insulating material on the patterned second layer of electrically conductive material.

9. The process in accordance with claim 8 including the additional step of forming at least one opening in the final layer of the electrically insulating material to expose at least one electrical contact area on the underlying patterned second layer of electrically conductive material.

10. The process in accordance with claim 7 further including the steps of forming at least one additional layer of patterned magnetic material and overlying electrically insulating layer, which steps are performed following step f and prior to step g.

11. The process in accordance with claim 10 comprising the additional step of forming a final layer of electrically insulating material on the patterned second layer of electrically conductive material.

12. The process in accordance with claim 11 including the additional step of forming at least one opening in the final layer of electrically insulating material to expose at least one electrical contact area on the underlying patterned second layer of electrically conductive material.

13. A process for fabricating discrete electrical microcomponents, said process comprising the steps of:
   a. disposing a first layer of electrically insulating material on a semiconductor substrate having active devices disposed therein and at least one electrical contact area disposed thereon;
   b. disposing a first layer of a magnetic material on the first layer of electrically insulating material;
   c. forming the first layer of magnetic material into a pattern in positioned relationship with respect to said at least one electrical contact area on the underlying semiconductor substrate;
   d. forming a second layer of electrically insulating material on the first layer of electrically insulating material and the patterned first magnetic layer;
   e. forming openings in the second and first layers of electrically insulating material to expose each electrical contact area on the underlying substrate;
   f. disposing a first layer of electrically conductive material on the second layer of electrically insulating material into each opening and into electrical contact with each exposed electrical contact area on the underlying substrate;
   g. forming the first layer of electrically conductive material into a first pattern in positioned relationship with respect to the underlying patterned first layer of magnetic material;
   h. disposing a third layer of electrically insulating material on the second layer of electrically insulating material and the patterned first layer of electrically conductive material;
   i. forming at least one opening in the third layer of insulating material to expose at least one electrical contact area on the underlying patterned first layer of electrically conductive material;
   j. disposing a second layer of electrically conductive material on the third layer of electrically insulating material into each opening and into electrical contact with each exposed electrical contact area on the underlying patterned first layer of electrically conductive material;
   k. forming the second layer of electrically conductive material into a pattern in positioned relationship with respect to the underlying patterned first layer of electrically conductive material;
   l. repeating steps h, i, j and k to form at least two, substantially parallel spiral coils of electrically conductive material, each coil having a central portion and at least one loop disposed around said central portion;
   m. disposing a final layer of electrically insulating material on the underlying layer of electrically insulating material and the underlying patterned final layer of electrically conductive material;
   n. forming at least one opening in the final layer of electrically insulating material and the underlying layers of electrically insulating material, each opening substantially aligned with the central portion of a respective coil, to expose at least one contact area on the underlying patterned first layer of magnetic material;
   o. forming a second layer of magnetic material on the final layer of electrically insulating material into each opening and into contact with each exposed contact area on the underlying patterned first layer of magnetic material; and p. forming the second layer of magnetic material into a pattern in positioned relationship with respect to the underlying patterned first layer of magnetic material.

14. A process for fabricating discrete electrical microcomponents, said process comprising the steps of:
   a. disposing a first layer of a magnetic material on the surface of an electrically insulating substrate;
   b. forming the first layer of magnetic material into a pattern;
   c. disposing a first layer of electrically insulating material over said patterned first magnetic layer;
   d. disposing a first layer of electrically conductive material on the first layer of electrically insulating material;
   e. forming the first layer of electrically conductive material into a first pattern in positioned relationship with respect to the underlying patterned first layer of magnetic material;
   f. disposing a second layer of electrically insulating material on the first layer of electrically insulating material and the patterned first layer of electrically conductive material; g. forming at least one opening in the second layer of electrically insulating material to expose at least one electrical contact area on the underling patterned first layer of electrically conductive material;
   h. disposing a second layer of electrically conductive material over the second layer of electrically insulating material into each opening and into electrical contact with each exposed electrical contact area on the underlying patterned first layer of electrical conductive material;
   i. forming the second layer of electrically conductive material into a pattern in positioned relationship with respect to the underlying patterned first layer of electrically conductive material;
   j. repeating steps f, g, h and i to form at least two substantially parallel spiral coils of electrically conductive material, each coil having a central portion and at least one loop disposed around said central portion;
   k. disposing a final layer of electrically insulating material over the underlying layer of electrically insulating material and the underlying patterned final layer of electrically conductive material;
   l. forming at least one opening in the final layer of electrically insulating material and the underlying layers of electrically insulating material, each opening substantially aligned with the central portion of a respective coil, to expose at least one contact area on the underlying patterned first layer of magnetic material;
   m. forming a second layer of magnetic material on the final layer of electrically insulating material into each opening and into contact with each exposed contact area on the underlying patterned first layer of magnetic material;
   n. forming the second layer of magnetic material into a pattern having in positioned relationship with respect to the underling patterned first layer of magnetic material;
   o. disposing a top layer of electrically insulating material over the underlying final layer of electrically insulating material and the underlying patterned second layer of magnetic material; and
   p. forming at least one opening in the top and final layers of electrically insulating material to expose at least one electrical contact area on the underling patterned final layer of electrically conductive material.

15. A process for fabricating discrete electrical microcomponents, said process comprising the steps of:
   a. disposing a first layer of electrically insulating material on a semiconductor substrate having at least one active device disposed therein;
   b. forming openings in the first layer of electrically insulating material to expose at least one electrical contact area on the underlying substrate;
   c. disposing a first layer of electrically conductive material on the first layer of electrically insulating material into each opening and into electrical contact with each exposed electrical contact area on the underlying substrate;
   d. forming the first layer of electrically conductive material into a first pattern;
   e. disposing a second layer of electrically insulating material on the first layer of electrically insulating material and the patterned first layer of electrically conductive material;
   f. forming at least one opening in the second layer of electrically insulating material to expose at least one electrical contact area on the underling patterned first layer of electrically conductive material;
   g. disposing a second layer of electrically conductive material over the second layer of electrically insulating material into each opening and into electrical contact with each exposed electrical contact area on the underlying patterned first layer of electrically conductive material; and
   h. forming the second layer of electrically conductive material into a second pattern in positioned relationship with respect to the underlying patterned first layer of electrically conductive material.

16. The process in accordance with claim 15 comprising the additional step of forming a final layer of electrically insulating material over the patterned second layer of electrically conductive material.

17. The process in accordance with claim 16 including the additional step of forming at least one opening in the final layer of electrically insulating material to expose at least one electrical contact area on the underlying patterned second layer of electrically conductive material.

18. A process for fabricating discrete electrical microcomponents, said process comprising the steps of:
   a. disposing a first layer of electrically conductive material on the surface of an electrically insulating substrate;
   b. forming the first layer of electrically conductive material into a first pattern;
   c. disposing a first layer of electrically insulating material on the surface of the electrically insulating substrate and the patterned first layer of electrically conductive material;
   d. forming at least one opening in the first layer of electrically insulating material to expose at least one electrical contact area on the underlying pattern first layer of electrically conductive material;
   e. disposing a second layer of electrically conductive material on the first layer of electrically insulating material into each opening and into electrical contact with each exposed electrical contact area of the underlying patterned first layer of electrically conductive material; and f. forming the second layer of electrically conductive material into a second pattern in positioned relationship with respect to the underlying patterned first layer of electrically conductive material.

19. The process in accordance with claim 18 comprising the additional step of forming a final layer of electrically insulating material over the patterned second layer of electrically conductive material.

20. The process in accordance with claim 19 including the additional step of forming at least one opening in the final layer of electrically insulating material to expose at least one electrical contact area on the underlying patterned second layer of electrically conductive material.

21. A process for fabricating discrete electrical microcomponents, said process comprising the steps of:
 a. disposing a first layer of electrically insulating material on a semiconductor substrate having at least one active device disposed therein and at least one electrical contact area disposed thereon;
 b. forming at least one opening in the first layer of electrically insulating material to expose each electrical contact area on the underlying substrate;
 c. disposing a first layer of electrically conductive material on the each first layer of electrically insulating material into each opening and into electrical contact with each exposed electrical contact area on the underlying substrate;
 d. forming the first layer of electrically conductive material into a first pattern;
 e. disposing a second layer of electrically insulating material on the first layer of electrically insulating material and the patterned first layer of electrically conductive material;
 f. forming at least one opening in the second layer of electrically insulating material to expose at least one electrical contact area on the underlying patterned first layer of electrically conductive material;
 g. disposing a second layer of electrically conductive material on the second layer of electrically insulating material into each opening and into electrical contact with each exposed electrical contact area on the underlying patterned first layer of electrically conductive material;
 h. forming the second layer of electrically conductive material into a pattern in positioned relationship with respect to the underlying patterned first layer of electrically conductive material;
 i. repeating steps e, f, g and h to form at least one spiral coil of conductive material, said at least one coil having at least one loop.

22. The process in accordance with claim 21 comprising the additional step of disposing a top layer of electrically insulating material over the underlying final layer of electrically insulating material and the underlying patterned final layer of electrically conductive material.

23. The process in accordance with claim 22 comprising the additional step of forming at least one opening in the top layer of electrically insulating material to expose at least one contact area on the underlying patterned final layer of electrically conductive material.

24. A process for fabricating discrete electrical microcomponents, said process comprising the steps of:
 a. disposing a first layer of electrically conductive material on the surface of an electrically insulating substrate;
 b. forming the first layer of electrically conductive material into a first pattern;
 c. forming a first layer of electrically insulating material on the surface of the electrically insulating substrate and the patterned first layer of electrically conductive material;
 d. forming at least one opening in the first layer of electrically insulating material to expose at least one electrical contact area on the underlying patterned first layer of electrically conductive material;
 e. disposing a second layer of electrically conductive material on the first layer of electrically insulating material into each opening and into electrically contact with each exposed electrical contact area of the underlying patterned first layer of electrically conductive material;
 f. forming the second layer of electrically conductive material into a pattern in positioned relationship with respect to the underlying patterned first layer of electrically conductive material;
 g. repeating steps c, d, e, and f to form at least one spiral coil of conductive material, said at least one coil having at least one loop.

25. The process in accordance with claim 24 comprising the additional step of disposing a final layer of electrically insulating material over the underlying layer of electrically insulating material and the underlying patterned final layer of electrically conductive material.

26. The process in accordance with claim 25 comprising the additional step of forming at least one opening in the final layer of electrically insulating material to expose at least one contact area on the underlying patterned final layer of electrically conductive material.

* * * * *

UNITED STATES PATENT AND TRADEMARK OFFICE
CERTIFICATE OF CORRECTION

PATENT NO. : 5,279,988
DATED : January 18, 1994
INVENTOR(S) : Irfan Saadat, Michael E. Thomas It is certified that error appears in the above-indentified patent and that said Letters Patent is hereby corrected as shown below: On the title page: Item [54] and Column 1, line 1, The title "Process For Making Microcomponents Integrated Circuits" should read --Process For Making Microcomponents For Integrated Circuits--.

Column 13, line 23, a new paragraph should begin after "material;"

Column 13, line 26, "underling" should read --underlying--
Column 13, line 61, "underling" should read --underlying--
Column 14, line 1, "underling" should read --underlying--
Column 14, line 25, "underling" should read --underlying--

Signed and Sealed this

Twentieth Day of December, 1994

BRUCE LEHMAN

Attest:

Attesting Officer

Commissioner of Patents and Trademarks